(12) United States Patent
Lin et al.

(10) Patent No.: US 7,772,895 B2
(45) Date of Patent: Aug. 10, 2010

(54) SIGNAL GENERATING CIRCUIT HAVING FILTERING CIRCUIT COUPLED BETWEEN LEVEL SHIFTERS

(75) Inventors: Kuo-Kai Lin, Taipei (TW); Hou-Kuan Sung, Taipei (TW)

(73) Assignee: ALi Corporation, Taipei (TW)

( * ) Notice: Subject to any disclaimer, the term of this patent is extended or adjusted under 35 U.S.C. 154(b) by 83 days.

(21) Appl. No.: 12/203,138

(22) Filed: Sep. 2, 2008

(65) Prior Publication Data

US 2009/0261873 A1 Oct. 22, 2009

(30) Foreign Application Priority Data

Apr. 21, 2008 (CN) .................. 2008 1 0091211

(51) Int. Cl.
*H03L 7/06* (2006.01)
(52) U.S. Cl. ....................... 327/148; 327/157
(58) Field of Classification Search ............. 327/147, 327/148, 150, 156, 157, 159, 319, 333
See application file for complete search history.

(56) References Cited

U.S. PATENT DOCUMENTS

| 6,396,430 B1 | 5/2002 | Li | |
| 6,747,497 B2* | 6/2004 | Ingino, Jr. | 327/157 |
| 6,774,696 B2* | 8/2004 | Clark et al. | 327/333 |
| 6,844,762 B2* | 1/2005 | Sanchez | 327/157 |
| 6,947,498 B2* | 9/2005 | Reed, Jr. | 375/326 |
| 7,248,086 B2 | 7/2007 | Frans et al. | |
| 7,459,964 B2* | 12/2008 | Dosho et al. | 327/554 |

* cited by examiner

*Primary Examiner*—Hai L Nguyen
(74) *Attorney, Agent, or Firm*—Winston Hsu (57) ABSTRACT

A signal generating circuit includes a detecting circuit, a charge pump, a first level shifter, a filtering circuit, a second level shifter and a controllable oscillator. The detecting circuit outputs a detecting signal according to a reference signal and an oscillating signal. The charge pump outputs a first output signal by performing a charging or discharging operation according to the detecting signal. The first level shifter adjusts a voltage level of the first output signal to thereby output a second output signal. The filtering circuit generates a first filtered control signal according to the second output signal. The second level shifter adjusts a voltage level of the first filtered controlling signal to output a second filtered control signal. The controllable oscillator outputs the oscillating signal according to the second filtered control signal.

8 Claims, 8 Drawing Sheets

FIG. 8

SIGNAL GENERATING CIRCUIT HAVING FILTERING CIRCUIT COUPLED BETWEEN LEVEL SHIFTERS

BACKGROUND OF THE INVENTION

1. Field of the Invention

The present invention relates to a signal generating circuit, and more particularly, to a phase lock loop (PLL) circuit applying MOS transistors with thicker gate oxide thicknesses as capacitor elements required within a filtering circuit (i.e., filter) to thereby improve an excessive leakage current caused by the whole PLL circuit while operating under a low supply voltage.

2. Description of the Prior Art

Owing to the development of semiconductor processes and the increasing availability of portable electronic apparatus, applying a low voltage design for diminishing a corresponding power and applying transistors having a smaller form factor has become a basic requirement of circuit design. The thicknesses of gate oxides of semiconductor elements are reduced as a result of the development of semiconductor processes from 0.18 micrometer semiconductors, to 0.13 micrometer semiconductors through to 65 nanometer semiconductors. Furthermore, for fitting the requirement of high speed and low power electronic circuit systems that are simultaneously capable of operating under a low voltage power supply system, most electronic circuit systems operate under a low supply voltage based on an all-digital process, wherein the all-digital process has the advantage of lower cost.

For modern circuit systems, a PLL (phase locked loop) circuit is a common electronic circuit used to generate clock signals by using a feedback scheme to reference instant phases of a reference signal and a feedback signal simultaneously, to thereby output a required stable clock signal. That is, when a phase relation between two different clock signals stays within a fixed range, the PLL circuit at this time is in a "phase locked" status.

In general, the operation of a PLL circuit (using a filtering circuit) is: converting a leading/lagging relation detected from a detecting circuit as a voltage/current signal to thereby control a frequency of an output oscillating signal (generated by a controllable oscillator) to achieve a goal of adjusting the phase of the output signal of the PLL circuit.

Figure 1:
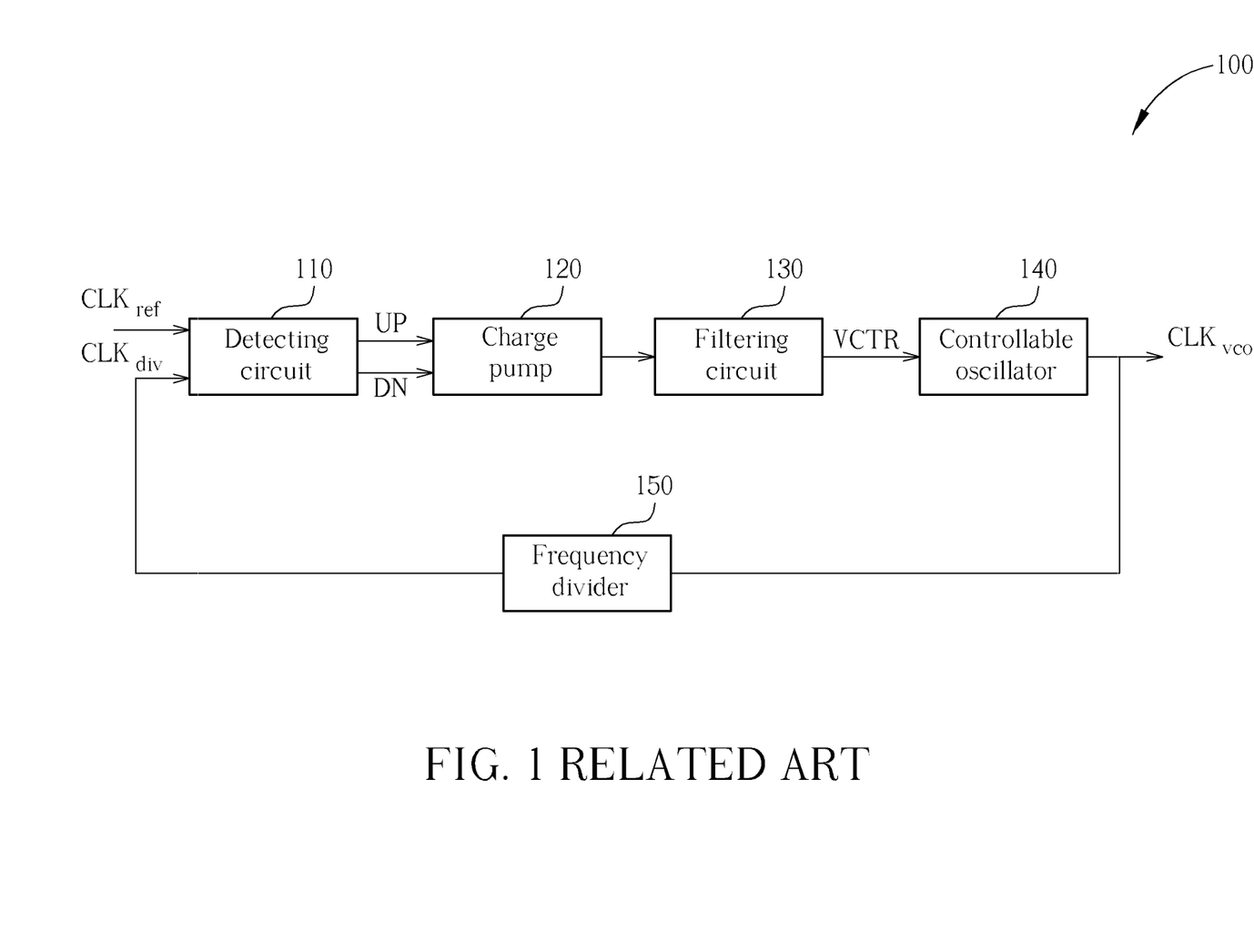
FIG. 1 is a block diagram illustrating a PLL circuit according to the related art.

Please refer to FIG. 1; FIG. 1 is a block diagram of a prior art PLL circuit 100. As shown in FIG. 1, a PLL circuit 100 generally includes a detecting circuit 110 (such as a phase/frequency detector, PFD), a charge pump 120, a filtering circuit 130 (e.g., a loop filter), a controllable oscillator 140 (e.g., a voltage controlled oscillator, VCO), and a frequency divider 150. The detecting circuit 110 detects a phase relation between a reference signal $CLK_{ref}$ and a feedback signal to thereby output a detecting signal, wherein the feedback signal here is a frequency-divided oscillating signal $CLK_{div}$ obtained by dividing a frequency of an oscillating signal $CLK_{vco}$ (as shown in FIG. 1) and the detecting signal is selectively an up signal UP or a down signal DN.

The charge pump 120 and the filtering circuit 130 then generates a control signal VCTR as an input signal of the controllable oscillator 140 according to the detecting signal (i.e., up signal UP or down signal DN); the controllable oscillator 140 hence is capable of adjusting the output signal (i.e., the oscillating signal $CLK_{vco}$) according to the control signal VCTR. Since the above operation and concepts should be clear to persons skilled in the art, they are therefore not detailed herein.

For meeting modern requirements, in most cases the capacitor element of the filtering circuit within the PLL circuit will adopt the MOS (metal oxide semiconductor) capacitor of the advanced process, the said MOS capacitor having a thinner gate oxide thickness that therefore leads to excessive leakage current of the PLL circuit 100; moreover, the excessive leakage current makes the output clock of PLL circuit 100 have unwanted jitter or causes the operation of the PLL circuit 100 to fail.

Figure 2:
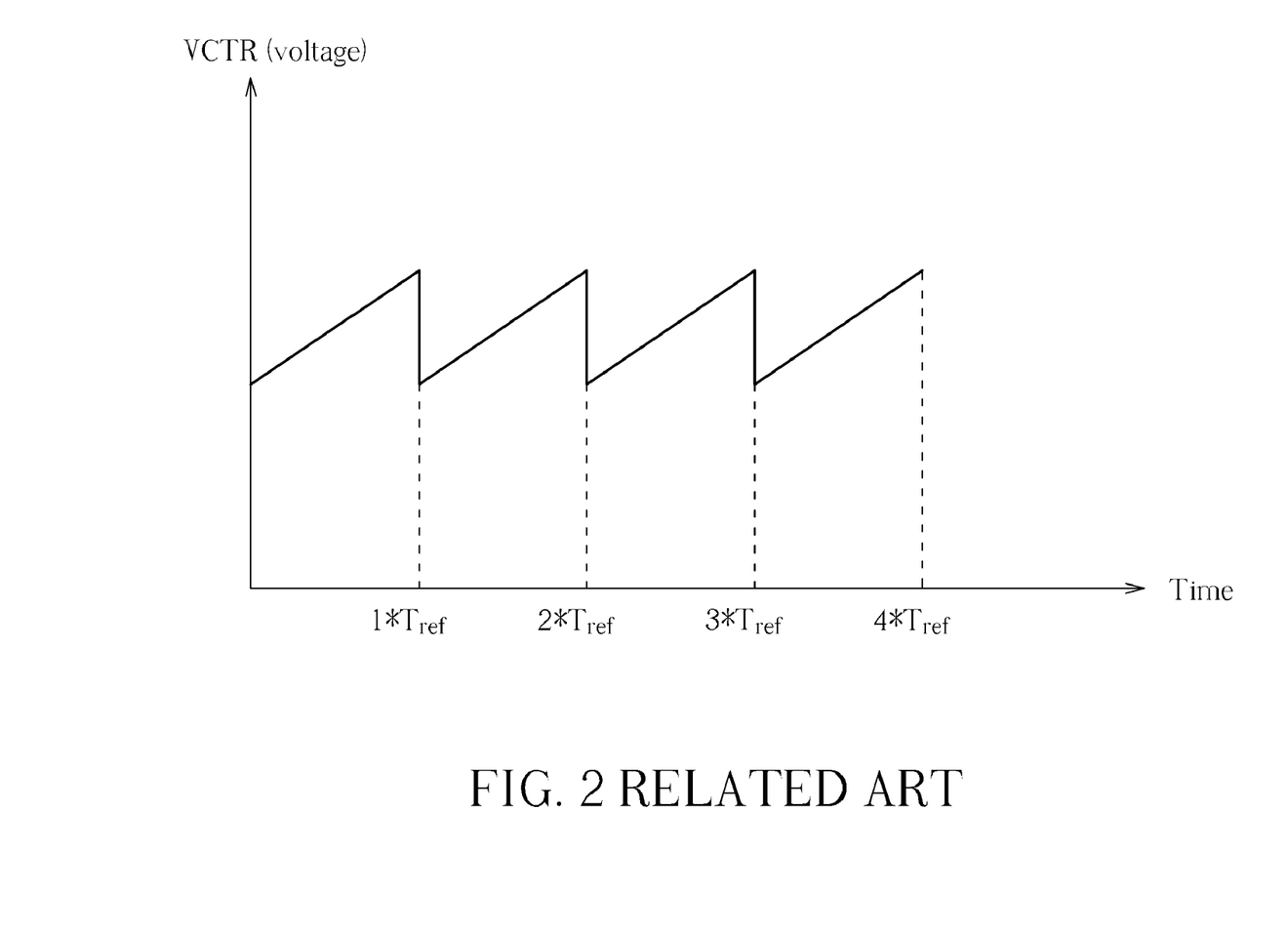
FIG. 2 is a waveform diagram of the control signal VCTR of the controllable oscillator.

Please refer to FIG. 2; FIG. 2 illustrates a waveform diagram of the control signal VCTR of the controllable oscillator 140. In advanced processes, the MOS capacitor with thin gate oxide thickness leads to excessive leakage current under normal operations, and the leakage current further causes the control signal VCTR to vary during a time interval between two individual operations of the detecting circuit 110, thereby affecting the output signal (oscillating signal $CLK_{vco}$) of the said PLL circuit 100.

In addition, the said low supply voltage for advanced processes causes the charge pump 120 to have a bad performance, and makes the controllable oscillator 140 can only get a limited range of the input voltage. However, on the premise of a same required oscillating range, diminishing the range of input voltage of the controllable oscillator 140 will induce an increased gain of the controllable oscillator 140. That is, the bad linearity and small dynamical range of the charge pump 120 and unwanted huge gain of the controllable oscillator 140 will degrade the performance of the prior PLL circuit 100.

From these issues, it becomes clear there remains considerable room for improvement of PLL circuits.

SUMMARY OF THE INVENTION

It is therefore an objective of the present invention to solve the aforementioned problems, and to provide a signal generating circuit (e.g., PLL circuit) using MOS transistors (i.e., MOS capacitors) with thicker gate oxide thicknesses as the capacitor of the filtering circuit to improve the said excessive leakage current in advanced processes. In addition, the signal generating circuit applies level shifters to make the filtering circuit operate under a higher supply voltage; the charge pump and the controllable oscillator respectively have a level shifter for matching the filtering circuit with a different supply voltage, to solve the PLL circuit issues and improve the performance of the output signal of the PLL circuit.

According to one embodiment of the present invention, a signal generating circuit is disclosed, the signal generating circuit includes: a detecting circuit, for outputting a detecting signal according to a reference signal and an oscillating signal; a charge pump, coupled to the detecting circuit, for outputting a first output signal according to the detecting signal; a first level shifter, coupled to the charge pump, for outputting a second output signal by adjusting a voltage level of the first output signal; a filtering circuit, coupled to the first level shifter, for outputting a first filtered control signal according to the second output signal; a second level shifter, coupled to the filtering circuit, for outputting a second filtered control signal by adjusting a voltage level of the first filtered control signal; and a controllable oscillator, coupled to the second level shifter, for outputting the oscillating signal according to the second filtered control signal.

According to another embodiment of the present invention, a signal generating circuit is disclosed, the signal generating circuit includes: a detecting circuit, for outputting a detecting signal according to a reference signal and an oscillating signal; a charge pump, coupled to the detecting circuit, for selectively executing a charging operation or a discharging operation to thereby output an output signal according to the detecting signal; a filtering circuit, coupled to the charge pump, for outputting a filtered control signal according to the output signal; and a controllable oscillator, coupled to the filtering circuit, for outputting the oscillating signal according to the filtered control signal; wherein the detecting circuit, the charge pump, and the controllable oscillator comprise a plurality of first transistors and a plurality of second transistors, and a gate oxide thickness of each second transistor is larger than a gate oxide thickness of each first transistor.

These and other objectives of the present invention will no doubt become obvious to those of ordinary skill in the art after reading the following detailed description of the preferred embodiment that is illustrated in the various figures and drawings.

DETAILED DESCRIPTION

Certain term are used throughout the following description and claims to refer to particular system components. As one skilled in the art will appreciate, manufacturers may refer to a component by different names. This document does not intend to distinguish between components that differ in name but not function.

As mentioned, an objective of the present invention is to provide a signal generating circuit (e.g., PLL circuit) using MOS transistors (i.e., MOS capacitors) with thicker gate oxide thicknesses as the capacitor of the filtering circuit to improve the said excessive leakage current of advanced processes. In addition, the signal generating circuit also improves the performance of the PLL circuit and decreases the jitter of the output signal of the PLL circuit.

For simplicity, in the following description, the PLL circuit is merely one embodiment of the disclosed signal generating circuit. In other words, in the present invention, the PLL circuit and the signal generating circuit are interchangeable terms.

In one embodiment of the present invention, the signal generating circuit operates the filtering circuit (loop filter) under a second power domain, and a first level shifter and a second level shifter are used to bridge the filtering circuit with adjacent circuit structures operated under a first power domain, where the supply voltage (e.g., 3.3 V) of the second power domain is higher than the supply voltage (e.g., 1.8 V, 1.2 V or 1.0 V, etc) of the first power domain.

That is, the signal generating circuit of the present invention uses the assistance of the first/second level shifter to make the circuit schemes of the signal generating circuit be normally operated under different power domains, thereby simultaneously improving the leakage current issue of the prior art PLL circuit.

Figure 3:
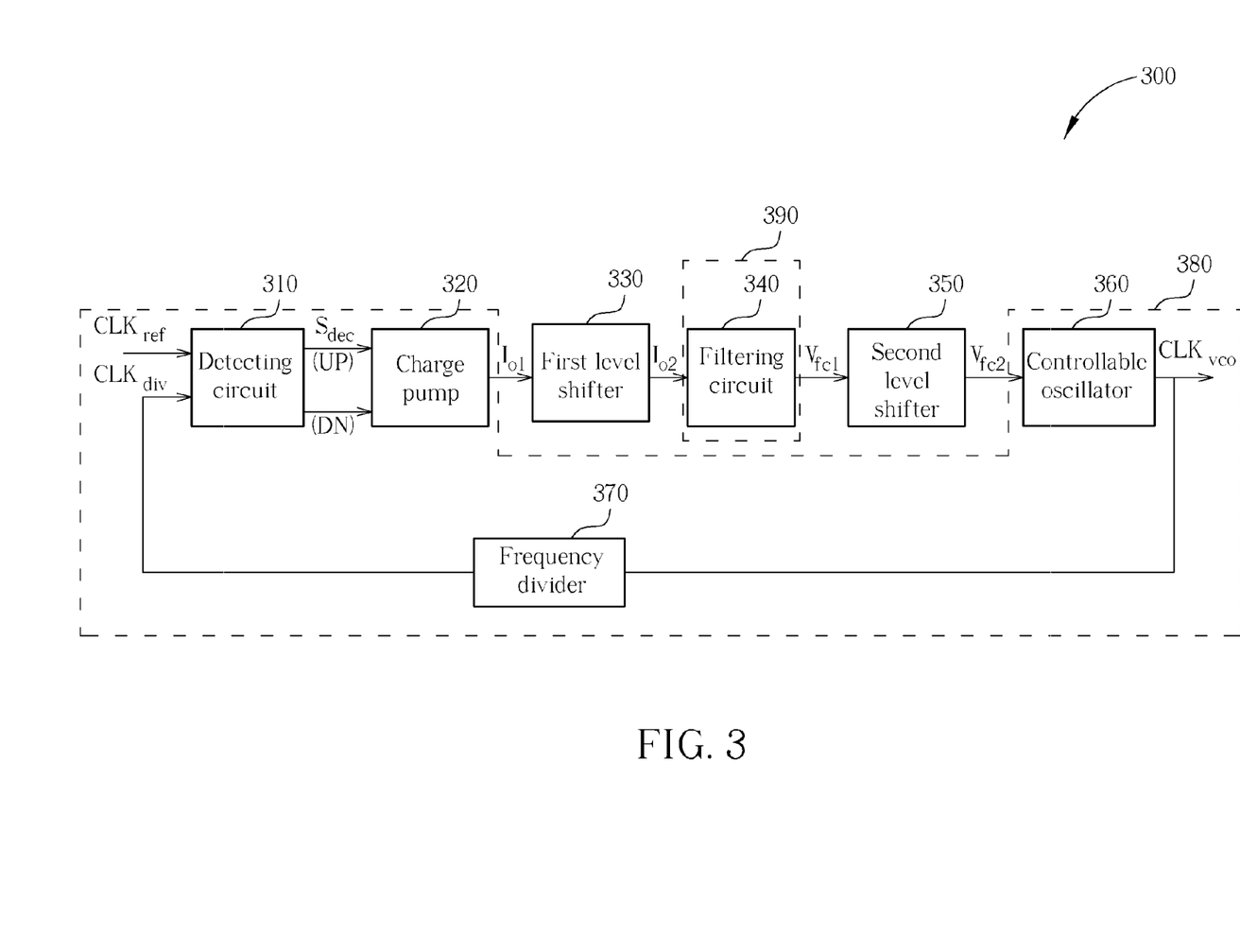
FIG. 3 is a diagram illustrating a block diagram of the PLL circuit according to an embodiment of the present invention.

Please refer to FIG. 3; FIG. 3 is a diagram illustrating a block diagram of the PLL circuit 300 according to an embodiment of the present invention. The PLL circuit 300 includes a detecting circuit 310, a charge pump 320, a first level shifter 330, a filtering circuit 340, a second level shifter 350, a controllable oscillator 360 and a frequency divider 370. In this embodiment; the detecting circuit 310 is implemented by a phase/frequency detector (PFD), and the filtering circuit 340 is a loop filter, where the loop filter herein is a low pass filter to filter out high frequency portions of the a second output signal $I_{o2}$. The second output signal $I_{o2}$ is generated from adjusting the first output signal $I_{o1}$ by the first level shifter 330.

In addition, the controllable oscillator 360 is implemented by a voltage controlled oscillator (VCO), where the controllable oscillator 360 is used for outputting an oscillating signal $CLK_{vco}$ according to a filtered control signal (e.g., a voltage signal $V_{fc2}$), and the frequency of the oscillating signal $CLK_{vco}$ is dependent on the voltage magnitude of the filtered control signal $V_{fc2}$, wherein the filtered control signal (i.e., second filtered control signal $V_{fc2}$) is adjusted from a first filtered control signal $V_{fc1}$ by the second level shifter 350.

In the following description, the functional block illustrated in FIG. 3 is an exemplary selection for illustration purposes only and is not intended as a limitation to the present invention. Furthermore, in the present invention the frequency divider 370 is an optional element; that is, in other embodiments, the frequency divider 370 can be omitted depending on the design requirements. In the following description, the implementation of the PLL circuit 300 with frequency divider 370 is for illustration purposes only and is not intended as a limitation to the present invention. Other circuit structures are also possible and fall within the scope of the present invention.

As shown in FIG. 3, the detecting circuit 310 is used for detecting a phase of a reference signal $CLK_{ref}$ and a phase of a feedback oscillating signal (e.g., frequency-divided signal $CLK_{div}$) to thereby generate a detecting signal $S_{dec}$. For instance, when the phase of the reference signal $CLK_{ref}$ is leading to the phase of the feedback oscillating signal $CLK_{div}$, the detecting signal Sdec is therefore an up signal UP; Otherwise, the detecting signal is a down signal DN.

The charge pump 320 is used for selectively executing a charging operation or a discharging operation according to a status of the detecting signal Sdec; that is, depending on whether the detecting signal Sdec is the up signal UP or the down signal DN. In other words, when the charge pump 320 receives the up signal UP, the charge pump 320 hence provides the filtering circuit 330 with a charging circuit for boosting a present output voltage level of the filtering circuit 330. When the charge pump 320 receives the down signal DN, the charge pump 320 hence provides the filtering circuit 330 with a discharging circuit for reducing a present output voltage level of the filtering circuit 330. The charge pump 320 and the filtering circuit 330 are used for providing the required control signal (i.e., a voltage signal herein) of the controllable oscillator 360.

In this embodiment, the first output signal $I_{o1}$ is delivered to the first level shifter 330. The first level shifter 330 then adjusts the voltage level of the first output signal $I_{o1}$ for generating a second output signal $I_{o2}$, where the voltage level of the second output signal $I_{o2}$ is higher than the voltage level of the first output signal $I_{o1}$. As mentioned above, the present invention employs boosting/reducing of the voltage level of signals to meet the requirement of MOS capacitors with thicker gate oxide thicknesses in order to improve the leakage current of the PLL circuit in advanced processes. However, in other embodiments of the present invention, the position of the first level shifter 330 and the second level shifter 350 are variable, and the relative positions of the first level shifter 330 and the second level shifter 350 shown in FIG. 3 are for illustration purposes only and not intended as a limitation to the present invention. The alternative designs also fall within the scope of the present invention. In the embodiment illustrated in FIG. 3, the output signal of the filtering circuit 340 is capable of providing the required higher voltage level to the MOS capacitor with thicker gate oxide in the filtering circuit 340, hence improving the phenomenon of excessive leakage current.

The filtering circuit 340 is used for filtering the high frequency portions within the second output signal $I_{o2}$ to generate a first filtered control signal $V_{fc1}$. That is, in this embodiment the filtering circuit 340 is a low pass filter. Moreover, the second level shifter 350 reduces the voltage level of the first filtered Control signal $V_{fc1}$ to generate a second filtered Control signal $V_{fc2}$ with a lower voltage level. The controllable oscillator 360 generates an oscillating signal $CLK_{vco}$ according to the second filtered Control signal $V_{fc2}$. The frequency divider 370 is coupled to the controllable oscillator 360 and the detecting circuit 310, for dividing the frequency of the oscillating signal $CLK_{vco}$ to output a frequency divided signal $CLK_{div}$ with lower frequency, and the frequency divided signal $CLK_{div}$ is the aforementioned feedback signal required for the detecting circuit 310 as one input signal.

In this embodiment, the detecting circuit 310, charge pump 320, controllable oscillator 360 and the frequency divider 370 are operated under a first power domain 380 (as shown in FIG. 3), while the filtering circuit 340 is operated under a different second power domain 390. As a result, the PLL circuit 300 is mainly operated under a low power domain (the first power domain 380) of the advanced process.

In addition, in this embodiment, the usage of the first power domain 380 and second power domain 390 are merely for illustration purposes only and are not intended as a limitation to the present invention. Any circuit structure in advanced processes using transistors of thick gate oxide thickness to replace partial elements within the PLL circuit to improve the leakage current of the circuitry obeys the spirit of the present invention and should be considered within the scope of the present invention.

As mentioned above, the capacitor within the filtering circuit 340 is implemented by transistor with thick gate oxides. Comparing the related art thin gate oxide transistors as the MOS capacitor to the present invention, the signal generating circuit 300 reduces the excessive leakage current and therefore improves the unwanted jitter phenomenon of the output clock signal.

Figure 4:
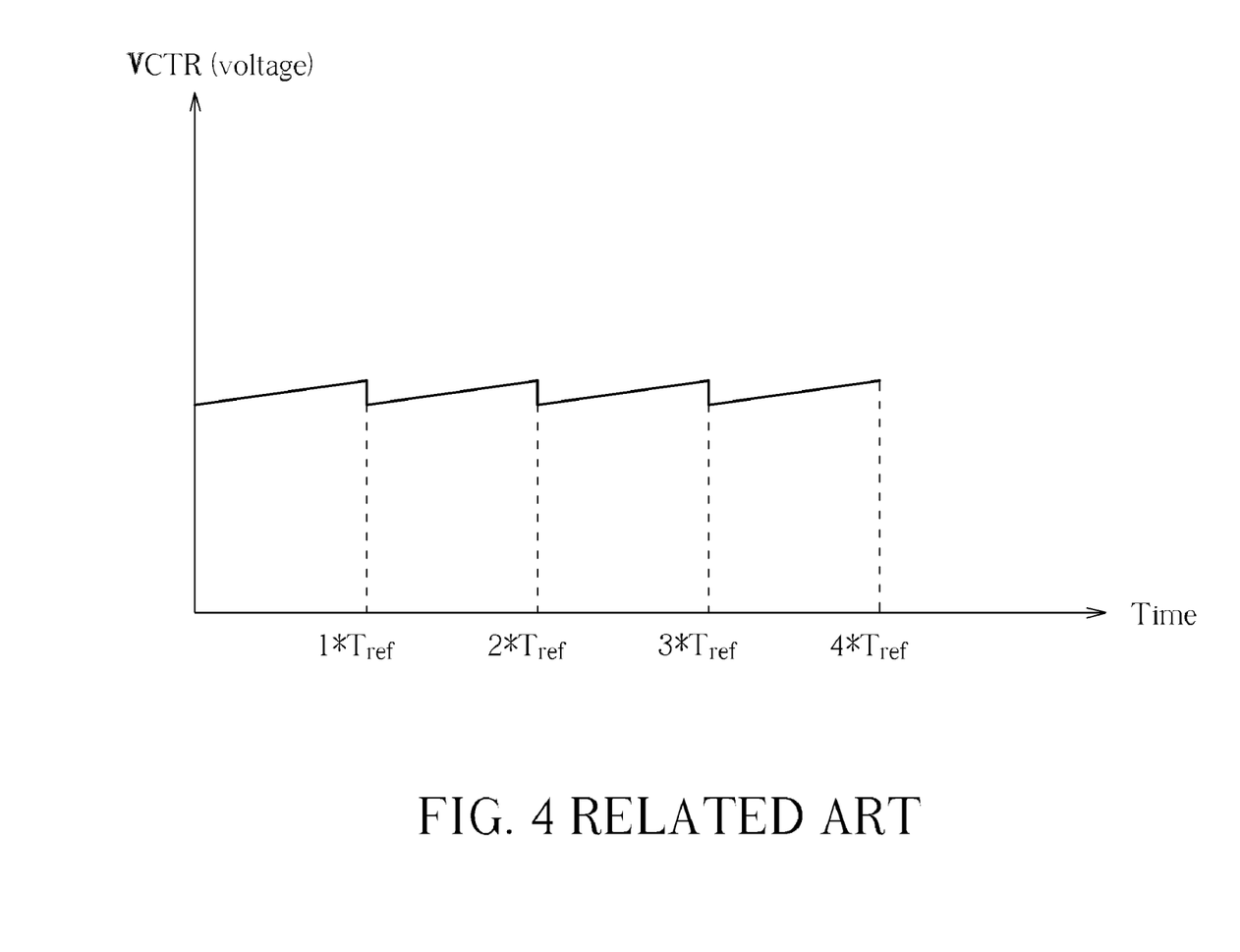
FIG. 4 is a waveform diagram of the first filtered control signal $V_{fc1}$ of the filtering circuit.

Please refer to FIG. 4 in conjunction with FIG. 3; FIG. 4 is a waveform diagram of the first filtered control signal $V_{fc1}$ of the filtering circuit 340.

As can be seen from the diagram, the unwanted influence by the leakage current of the first filtered control signal $V_{fc1}$ is suppressed herein. This leads to the output signal of the PLL circuit 300 having better stability; that is, compared to the related art, the performance of the PLL circuit 300 is upgraded.

Figure 5:
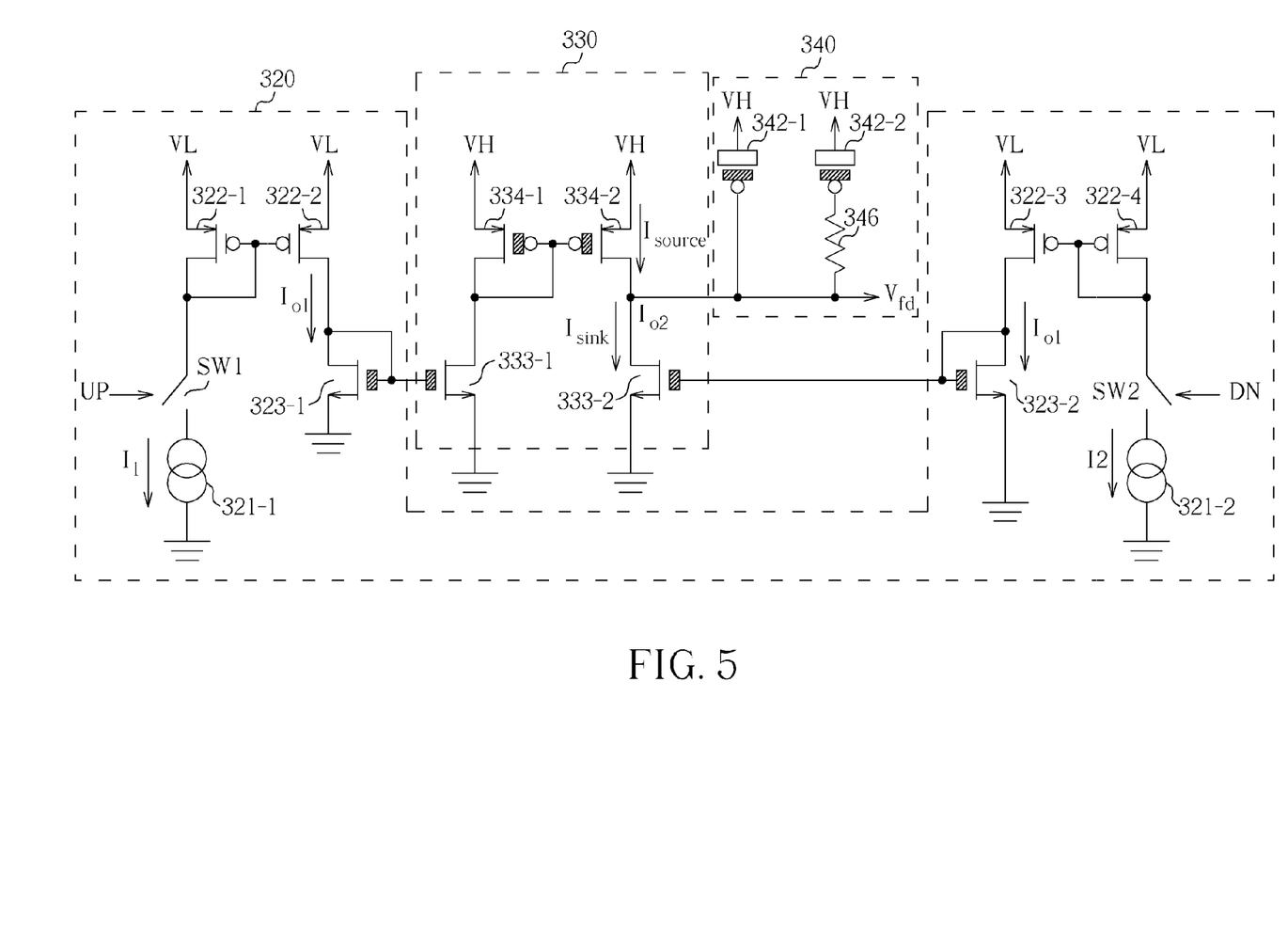
FIG. 5 is a circuit diagram illustrating the charge pump, the first level shifter 330 and the filtering circuit.

Please refer to FIG. 5; FIG. 5 is a circuit diagram illustrating the charge pump 320, the first level shifter 330 and the filtering circuit 340. As shown in FIG. 5, the charge pump 320 includes a first charge pump unit and a second charge pump unit which operates, respectively, according to the up signal UP and the down signal DN. Wherein the first charge pump unit includes a current source 321-1, two PMOS transistors with thin gate oxide (322-1, 322-2), a switch SW1 and a NMOS transistor 323-1 with thick gate oxide; the second charge pump unit includes a current source 321-2, two PMOS transistors with thin gate oxide (322-3, 322-4), a switch SW2 and a NMOS transistor 323-2 with thick gate oxide.

In addition, in this embodiment, the first level shifter 330 includes two NMOS transistors with thick gate oxide (333-1, 333-2) and two PMOS transistors with thick gate oxide (334-1, 334-2). The filtering circuit 340, as shown in FIG. 5, is a two-order filter with two capacitors 342-1, 342-2 and a resistor 346. Compared to the related loop filter, the filtering circuit 340 in this embodiment adopts PMOS transistors with thick gate oxides. The usage of a two-order filter in this embodiment is an exemplary selection for illustration purposes only and is not intended as a limitation to the present invention. Alternative structures of the filtering circuit 340 of transistors with thick gate oxide also should be considered within the scope of the present invention.

As shown in FIG. 5; PMOS transistors 322-1 and 322-2 form a first current mirror, while NMOS transistors 323-1 and 333-1 form a second current mirror, PMOS transistors 334-1 and 334-2 form a third current mirror, NMOS transistors 333-2 and 323-2 form a fourth current mirror, and PMOS transistors 322-3 and 322-4 form a fifth current mirror.

In this embodiment, when the detecting circuit 310 outputs the up signal UP, the switch SW1 of the charge pump 320 turns on and the switch SW2 is off. Hence, the current I1 flows through the said first current mirror to thereby generate a first output signal $I_{o1}$, the first output signal $I_{o1}$ then flows through the second current mirror and the third current mirror to generate a charging current $I_{source}$ to boost up the voltage level of the first filtered control signal $V_{fc1}$ outputted from the filtering circuit 340. In other words, when the detecting circuit 310 outputs the up signal UP, the charge pump 320 executes a charging operation to increase the voltage level of the first output signal $I_{o1}$ since the capacitors herein is charging.

When the detecting circuit 310 outputs the down signal DN, the switch SW2 of the charge pump 320 turns on and the switch SW1 is off. Hence, the current I2 provided by the current source 321-2 flows through the said fifth current mirror to thereby generate the first output signal $I_{o1}$, the first output signal $I_{o1}$ then flows through the fourth current mirror to generate a discharging current $I_{sink}$ to reduce the voltage level of the first filtered control signal $V_{fc1}$ outputted from the filtering circuit 340. In other words, when the detecting circuit 310 outputs the down signal DN, the charge pump 320 executes a discharging operation accordingly to reduce the voltage level of the first output signal $I_{o1}$ since the capacitors herein are discharging.

Due to the said PMOS transistors 322-2 and 322-3 and the said NMOS transistors 323-1 and 323-2 of the charge pump 320 being operated at a voltage range between 0~VL (e.g., 1.8 voltage) voltage while the said PMOS transistors 334-1 and 334-2 and the said NMOS transistors 333-1 and 333-2 of the first level shifter are operated at a voltage range between 0~VH (e.g., 3.3 v), by means of the said current mirrors and conversion between current and voltage, the first level shifter 330 converts the input signal with a lower voltage level to the output signal with a higher voltage level accordingly.

Figure 6:
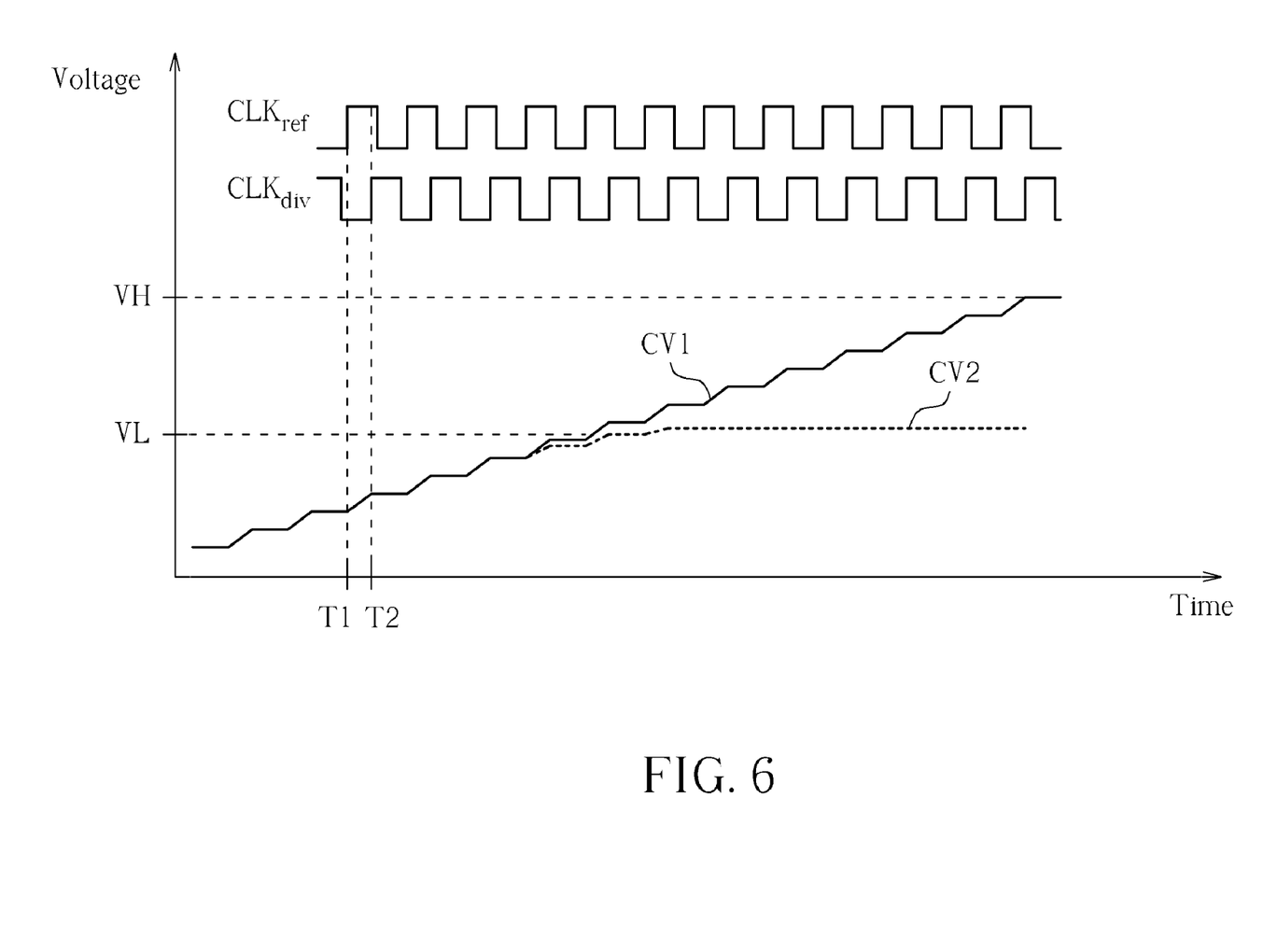
FIG. 6 is a diagram illustrating a curve diagram of both the charge pump and the prior art charge pump.

Please refer to FIG. 6; FIG. 6 is a diagram illustrating a curve diagram of both the charge pump 320 and the prior art charge pump 120. As shown in FIG. 6, a relation between time and output voltages respectively of the charge pump 120 and the charge pump 320 are illustrated. In addition, in this embodiment, a curve CV1 expresses the character of the charge pump 320 of the present invention while another curve CV2 expresses the character of the charge pump 120 according to the related art. As shown in FIG. 6, at time T1 the reference signal CLKref is at a rising edge, and the frequency divided oscillating signal CLKdiv be at a rising edge at time T2. That is, at time T1, the detecting circuit 310 and 110 respectively determine the phase of the frequency divided oscillating signal $CLK_{div}$ is inferior to the phase of the reference signal $CLK_{ref}$ and therefore outputs the detecting signal UP to boost up the voltage level of the output voltage of the filtering circuit 340 and 130 till the time T2.

For the prior art PLL circuit 100 in the said advanced process, the filtering circuit 130 operates under the voltage rage between 0~VL. In the present invention, the filtering circuit 340 of the signal generating circuit 300 operates under the said second power domain 390 with the voltage range between 0~VH voltage. Due to the first level shifter 330, the charge pump 320 can fit within the filtering circuit 340 and the output dynamic range of the charge pump 320 and the linear range are better than the prior art charge pump 120. Results in the signal generating circuit 300 show a better performance under the low supply voltage.

Figure 7:
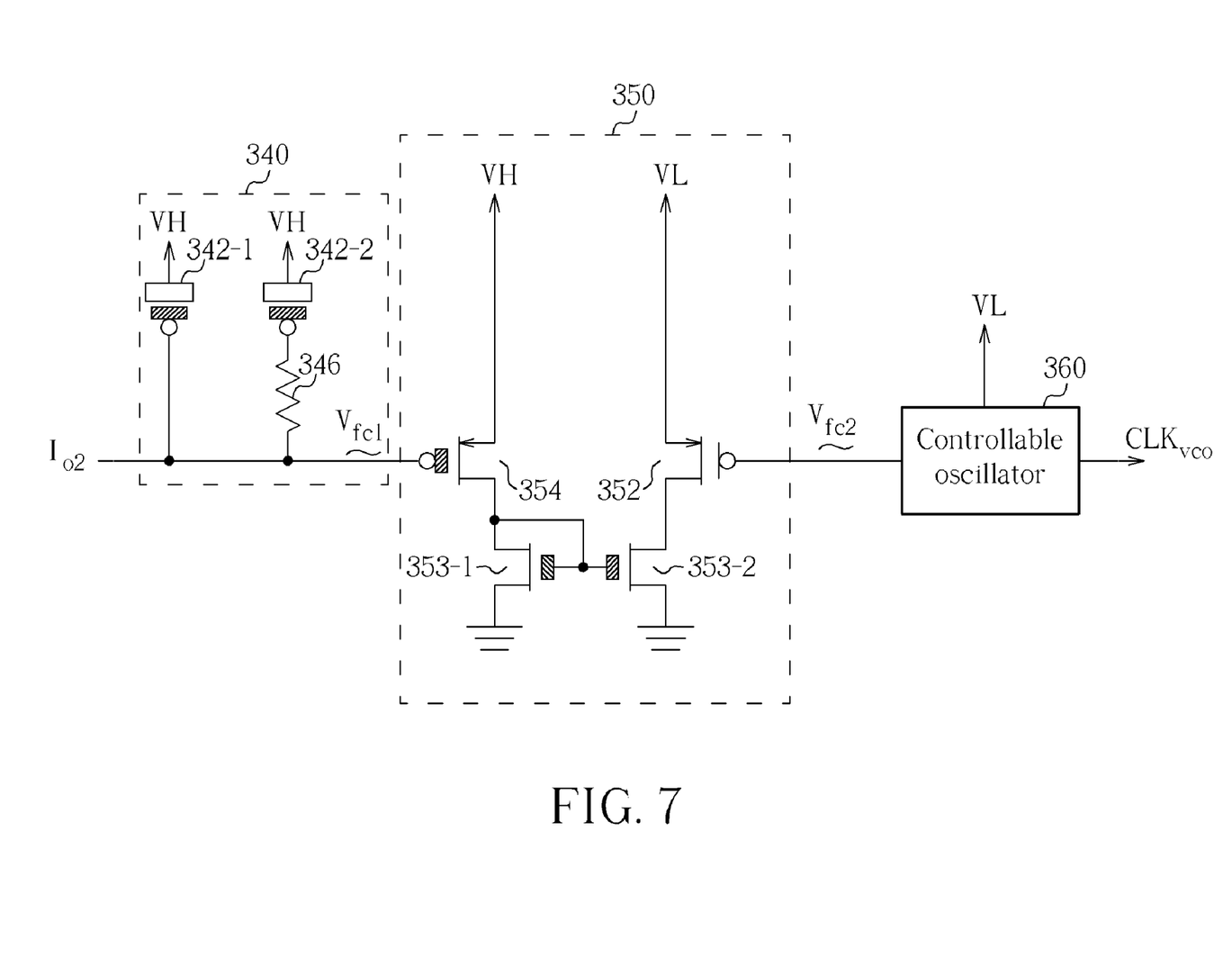
FIG. 7 is a diagram illustrating a block diagram of the filtering circuit, the second level shifter and the controllable oscillator according to an embodiment of the present invention.

Please refer to FIG. 7; FIG. 7 is a diagram illustrating a block diagram of the filtering circuit 340, the second level shifter 350 and the controllable oscillator 360 according to an embodiment of the present invention. The structure of the filtering circuit 340 has been described above, and the second level shifter 350 includes two NMOS transistors with thick gate oxide (353-1, 353-2) and a PMOS transistor with thick gate oxide 354, and a PMOS transistor with thin gate oxide 352. In addition, the NMOS transistors with thick gate oxide (353-1, 353-2) form a current mirror, and the PMOS transistor with thick gate oxide 354 and the NMOS transistors with thick gate oxide 353-1 are operated under a voltage range between 0~VH voltage, while the PMOS transistor with thin gate oxide 352 and the NMOS transistors with thick gate oxide 353-2 are operated under a voltage range between 0~VL voltage.

Hence, the second level shifter 350 converts the input signal with a higher voltage level to the output signal with a lower voltage level accordingly. That is, the voltage level of the second filtered control signal $V_{fc2}$ is lower than the voltage level of the first filtered control signal $V_{fc1}$, to achieve the goal of providing the controllable oscillator 360 with the required control voltage, wherein the said controllable oscillator 360 operates under the first power domain with the voltage range between 0~VL voltage. The components within the controllable oscillator 360 are transistors with thin gate oxides and are operated under the first power domain 380 with a supply voltage VL. Apart from the bridge transistor between the controllable oscillator 360, the components of the second level shifter 350 are all transistors with thick gate oxides.

Figure 8:
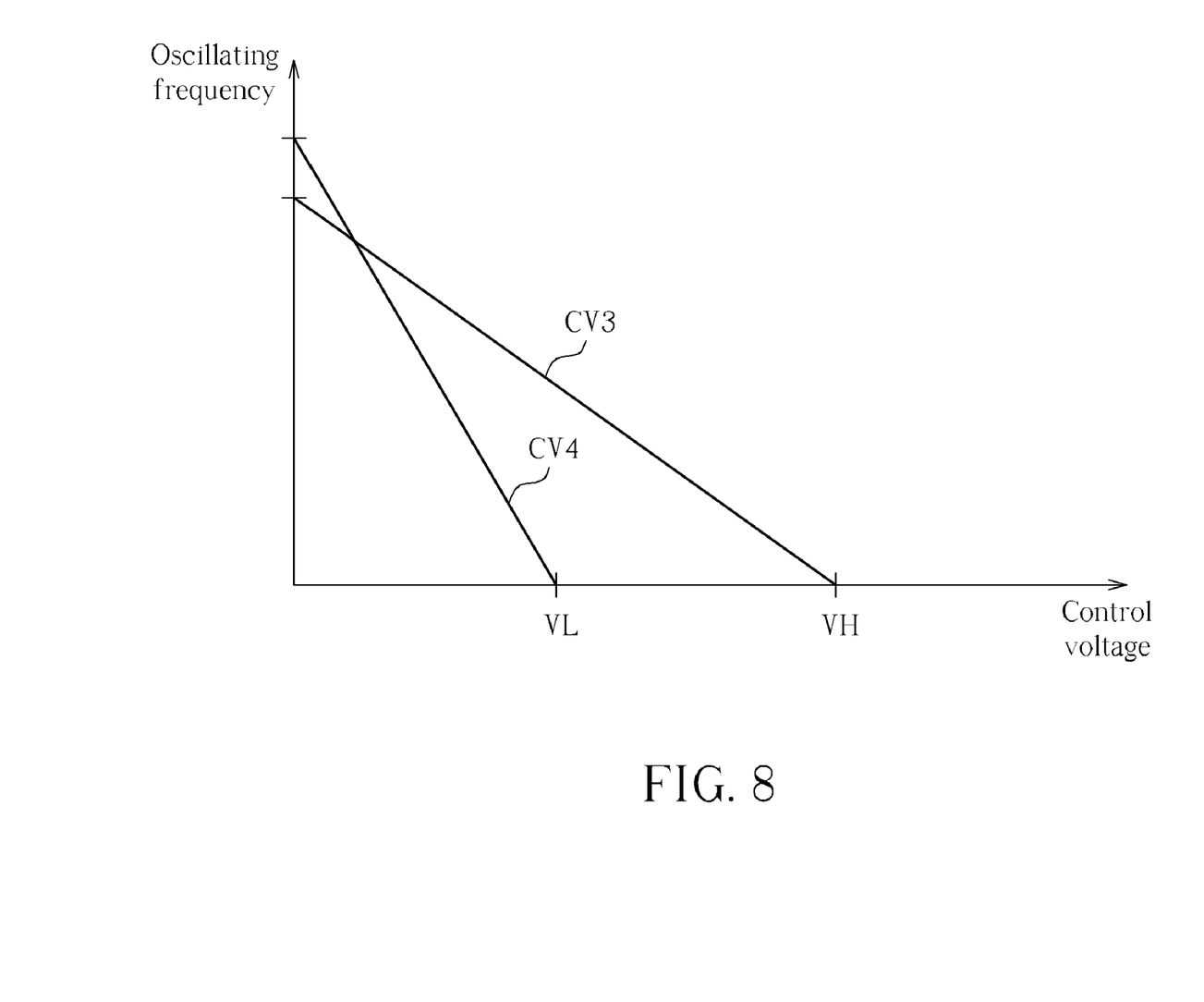
FIG. 8 is a diagram illustrating two characteristic curves respectively corresponding to the controllable oscillator of FIG. 3 and to the controllable oscillator of FIG. 1.

Please refer to FIG. 8; FIG. 8 is a diagram illustrating two characteristic curves respectively corresponding to the controllable oscillator 360 of FIG. 3 and to the controllable oscillator 140 of FIG. 1. As shown in FIG. 8, a curve CV3 expresses a relation between the control voltage and the oscillating frequency of the output clock corresponding to the controllable oscillator 360 of the present invention while a curve CV4 expresses a relation between the control voltage and the oscillating frequency of the output clock corresponding to the prior art controllable oscillator 160. In other words, the curve CV3 represents a gain characteristic of the controllable oscillator 360 and the curve CV4 represents a gain characteristic of the controllable oscillator 140.

As shown in FIG. 8, because of the configuration of the second level shifter 350, the controllable oscillator 360 not only fits in with the said filtering circuit 340 but also leads to a slope of the curve CV3 smaller than a slope of the curve CV4, wherein here an oscillating gain of an oscillator expresses the relationship between the control voltage and the output clock; that is, in this embodiment, the controllable oscillator 360 has a smaller oscillating gain than the prior art controllable oscillator 160. On account of the smaller oscillating gain as compared to the prior art controllable oscillator 160, the signal disturbances have less influence on the output clock and result in the suppressed jitter of the disclosed signal generating circuit 300; hence the disclosed signal generating circuit 300 has better performance while operating under the low supply voltage required by the advanced processes. That is, the controllable oscillator 360 (voltage controlled oscillator) with a smaller oscillating gain leads to a better quality of the output clock of the disclosed signal generating circuit 300.

FIG. 5 and FIG. 7 are for illustration purposes only and not a limitation of the present invention; any alternative design of the first level shifter 330, filtering circuit 340 and the second level shifter 350 also obeys the spirit of the present invention and falls within the scope of the present invention.

In conclusion, the said embodiment of the present invention provides a circuit structure capable of suppressing the undesired leakage current for improving the jitter degree of the output clock of the signal generating circuit. Comparing to the prior art PLL circuits that mostly utilize a compensating circuit for compensating the leakage current, the disclosed signal generating circuit has a lower circuit complexity, a smaller required area, and has a superior compatibility with the said advanced processes.

Furthermore, the disclosed signal generating circuit improves the characteristics of both the charge pump and the controllable oscillator to therefore promote the quality of the output clock of the signal generating circuit, for instance, by means of enlarging the dynamic range of the charge pump and diminishing the oscillating gain of the controllable oscillator.

Those skilled in the art will readily observe that numerous modifications and alterations of the device and method may be made while retaining the teachings of the invention.

What is claimed is:
1. A signal generating circuit, comprising:
a detecting circuit, for generating a detecting signal according to a reference signal and an oscillating signal;
a charge pump, coupled to the detecting circuit, for outputting a first output signal according to the detecting signal;
a first level shifter, coupled to the charge pump, for generating a second output signal according to a voltage level of the first output signal, wherein a voltage level of the second output signal is different from the voltage level of the first output signal;
a filtering circuit, coupled to the first level shifter, for generating a first filtered control signal according to the second output signal;
a second level shifter, coupled to the filtering circuit, for generating a second filtered control signal according to a voltage level of the first filtered control signal, wherein a voltage level of the second filtered control signal is different from the voltage level of the first output signal; and a controllable oscillator, coupled to the second level shifter, for generating the oscillating signal according to the second filtered control signal.

2. The signal generating circuit of claim 1, further comprising:
a frequency divider, coupled to the controllable oscillator and the detecting circuit, for dividing a frequency of the oscillating signal to thereby generate a frequency-divided oscillating signal;
wherein the detecting circuit generates the detecting signal according to the reference signal and the frequency-divided oscillating signal.

3. The signal generating circuit of claim 1, wherein the detecting circuit, the charge pump, and the controllable oscillator comprise a plurality of first transistors and a plurality of second transistors, the filtering circuit comprises at least one second transistor, and a gate oxide thickness of each second transistor is greater than a gate oxide thickness of each first transistor.

4. The signal generating circuit of claim 3, wherein the detecting circuit, the charge pump, and the controllable oscillator are operated under a first power domain, and the filtering circuit is operated under a second power domain different from the first power domain.

5. The signal generating circuit of claim 4, wherein a supply voltage of the first power domain is lower than a supply voltage of the second power domain.

6. The signal generating circuit of claim 3, wherein the first level shifter comprises a plurality of second transistors, and the charge pump comprises:
a first charge pump unit, for executing a charging operation according to the detecting signal to thereby determine the first output signal utilized for charging the filtering circuit, the first charge pump unit comprising:
a first current source;
a plurality of first transistors;
a switch, for coupling the first current source to one first transistor of the first transistors within the first charge pump unit according to the detecting signal; and
a second transistor, coupled to another first transistor of the first transistors within the first charge pump unit and one second transistor of the second transistors within the first level shifter; and
a second charge pump unit, for executing a discharging operation according to the detecting signal to thereby determine the first output signal utilized for discharging the filtering circuit, the second charge pump unit comprising:
a second current source;
a plurality of first transistors;
a switch, for coupling the second current source to one first transistor of the first transistors within the second charge pump unit according to the detecting signal; and
a second transistor, coupled to another first transistor of the first transistors within the second charge pump unit and one second transistor of the second transistor within the second level shifter.

7. The signal generating circuit of claim 1, wherein the detecting circuit, the charge pump, and the controllable oscillator are operated under a first power domain, and the filtering circuit is operated under a second power domain different from the first power domain.

8. The signal generating circuit of claim 7, wherein a supply voltage of the first power domain is lower than a supply voltage of the second power domain.

* * * * *